United States Patent
Bojkov et al.

(10) Patent No.: US 10,832,984 B2
(45) Date of Patent: Nov. 10, 2020

(54) ENVIRONMENTAL PROTECTION FOR WAFER LEVEL AND PACKAGE LEVEL APPLICATIONS

(71) Applicant: Qorvo US, Inc., Greensboro, NC (US)

(72) Inventors: Christo Bojkov, Plano, TX (US); Andrew Ketterson, Dallas, TX (US); Robert Charles Dry, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/743,345

(22) Filed: Jan. 15, 2020

(65) Prior Publication Data

US 2020/0152533 A1 May 14, 2020

Related U.S. Application Data

(62) Division of application No. 15/797,310, filed on Oct. 30, 2017, now Pat. No. 10,651,103.

(60) Provisional application No. 62/414,101, filed on Oct. 28, 2016.

(51) Int. Cl.
*H01L 23/29* (2006.01)
*H01L 23/00* (2006.01)
*H01L 23/31* (2006.01)
*H01L 21/56* (2006.01)

(52) U.S. Cl.
CPC ............ *H01L 23/293* (2013.01); *H01L 21/56* (2013.01); *H01L 23/3128* (2013.01); *H01L 23/3135* (2013.01); *H01L 23/564* (2013.01)

(58) Field of Classification Search
CPC combination set(s) only.
See application file for complete search history.

(56) References Cited

U.S. PATENT DOCUMENTS

| | | | |
|---|---|---|---|
| 6,564,449 B1 * | 5/2003 | Tsai | H01L 24/03 257/E21.519 |
| 9,659,898 B1 | 5/2017 | Railkar et al. | |
| 2004/0217453 A1 | 11/2004 | Ogino et al. | |
| 2006/0091536 A1 * | 5/2006 | Huang | H01L 24/05 257/734 |
| 2006/0216603 A1 | 9/2006 | Choi | |
| 2007/0160846 A1 | 7/2007 | Koinuma et al. | |
| 2008/0179757 A1 * | 7/2008 | Yamamori | H01L 23/3128 257/777 |

(Continued)

OTHER PUBLICATIONS

Author Unknown, "Vectra: liquid crystal polymer (LCP)," Product Information, Oct. 2007, Ticona GmbH, 80 pages.

(Continued)

*Primary Examiner* — Nduka E Ojeh
(74) *Attorney, Agent, or Firm* — Withrow & Terranova, P.L.L.C.

(57) ABSTRACT

A method includes the steps of fabricating one or more semiconductor devices on a semiconductor wafer and depositing one or more conformal organic environmental protection layers over the semiconductor wafer using a vapor deposition process. By depositing the one or more conformal organic environmental protection layers using a vapor deposition process, thin film conformal organic environmental protection layers may be provided that offer excellent protection against water and oxygen ingress, thus increasing the ruggedness and reliability of the resulting semiconductor die.

8 Claims, 6 Drawing Sheets

(56) References Cited

U.S. PATENT DOCUMENTS

| | | | |
|---|---|---|---|
| 2010/0096659 A1 | 4/2010 | Noma | |
| 2010/0301450 A1* | 12/2010 | Lin | H01L 21/4857 257/531 |
| 2011/0031479 A1 | 2/2011 | Ryu et al. | |
| 2011/0057742 A1* | 3/2011 | Frye | H01P 5/10 333/26 |
| 2013/0256711 A1* | 10/2013 | Joo | H01L 33/505 257/88 |
| 2015/0255368 A1 | 9/2015 | Costa | |
| 2015/0344697 A1 | 12/2015 | Nam et al. | |
| 2015/0376447 A1* | 12/2015 | Kawabe | B32B 27/36 428/418 |
| 2016/0365699 A1 | 12/2016 | Lell et al. | |
| 2017/0131551 A1 | 5/2017 | Robbins et al. | |
| 2018/0033709 A1* | 2/2018 | Kuroda | H01L 23/3128 |
| 2018/0122716 A1 | 5/2018 | Bojkov et al. | |

OTHER PUBLICATIONS

Author Unknown, "Liquid Crystal Polymer (Vectra)," Material Properties Sheet, Robison Electronics, Paso Robles, California, published at least as early as Nov. 2, 2017, 1 page.

Gao, Feng, et al., "Impact of Water-Assisted Electrochemical Reactions on the OFF-State Degradation of AlGaN/GaN HEMTs," IEEE Transactions on Electron Devices, vol. 61, Issue 2, Feb. 2014, pp. 437-444.

Harkonen, Emma, et al., "Corrosion Protection of Steel with Oxide Nanolaminates Grown by Atomic Layer Deposition," Journal of The Electrochemical Society, vol. 158, Issue 11, 2011, pp. C369-C378.

Wang, Xuefeng, et al., "Micromachining Techniques for Liquid Crystal Polymer," Micro Electro Mechanical Systems, Jan. 25, 2001, Interlaken, Switzerland, IEEE, 5 pages.

Non-Final Office Action for U.S. Appl. No. 15/797,310, dated Jun. 12, 2018, 16 pages.

Final Office Action for U.S. Appl. No. 15/797,310, dated Oct. 24, 2018, 19 pages.

Advisory Action for U.S. Appl. No. 15/797,310, dated Nov. 30, 2018, 3 pages.

Non-Final Office Action for U.S. Appl. No. 15/797,310, dated Jan. 22, 2019, 17 pages.

Non-Final Office Action for U.S. Appl. No. 15/797,310, dated Mar. 13, 2019, 18 pages.

Final Office Action for U.S. Appl. No. 15/797,310, dated May 21, 2019, 20 pages.

Advisory Action for U.S. Appl. No. 15/797,310, dated Jul. 31, 2019, 3 pages.

Non-Final Office Action for U.S. Appl. No. 15/797,310, dated Aug. 19, 2019, 10 pages.

Final Office Action for U.S. Appl. No. 15/797,310, dated Nov. 1, 2019, 12 pages.

Notice of Allowance for U.S. Appl. No. 15/797,310, dated Dec. 4, 2019, 11 pages.

\* cited by examiner

ENVIRONMENTAL PROTECTION FOR WAFER LEVEL AND PACKAGE LEVEL APPLICATIONS

RELATED APPLICATIONS

This application is a divisional application of U.S. patent application Ser. No. 15/797,310, filed Oct. 30, 2017, now U.S. Pat. No. 10,651,103, which claims the benefit of provisional patent application Ser. No. 62/414,101, filed Oct. 28, 2016, the disclosures of which are hereby incorporated herein by reference in their entireties.

FIELD OF THE DISCLOSURE

The present disclosure relates to semiconductor die and integrated circuit packages including conformal organic protective films for protecting from environmental exposure.

BACKGROUND

Semiconductor die and integrated circuit packages are used in myriad applications. Often, these applications result in exposure of the semiconductor die and integrated circuit packages to environmental conditions such as high temperature, humidity, and the like. To prolong the lifetime of devices incorporating semiconductor die and integrated circuit packages, environmental protection is paramount. Specifically, protecting semiconductor die and integrated circuit packages from degradation due to moisture ingress is necessary for maintaining reliability of the devices.

Generally, environmental protection may be applied at the wafer level or the package level. State of the art wafer level environmental protection involves the application of one or more thin film inorganic environmental protection layers, as illustrated in FIGS. 1A and 1B. FIG. 1A shows a semiconductor wafer 10, which is separated into a number of discrete semiconductor die 12. FIG. 1B shows a cross-sectional view of a portion of one of the semiconductor die 12, which includes a substrate 14, an active area 16 in a top portion of the substrate 14, one or more intermediate layers 18 over the substrate 14, one or more metallization layers 20 over the one or more intermediate layers 18, and one or more inorganic environmental protection layers 22 over the one or more metallization layers. Those skilled in the art will appreciate that the active area 16 may include one or more implanted, diffused, or epitaxially grown regions, and that the one or more intermediate layers 18 and the one or more metallization layers 20 may be patterned to form any number of semiconductor devices in the semiconductor die 12. For example, one or more implanted, diffused, or epitaxial regions in the active area 16 may interact with an intermediate layer 18 of oxide or nitride and one or more portions of a metallization layer 20 to form one or more transistors, one or more diodes, and the like.

Conventionally, the inorganic environmental protection layers 22 are applied via atomic layer deposition (ALD), and comprise oxides such as tantalum pentoxide ($Ta_2O_4$), aluminum oxide ($Al_2O_3$), or silicon nitride ($Si_3N_4$). While initially promising from an environmental protection perspective, these inorganic environmental protection layers 22 have proved inadequate in harsh environmental conditions. For example, when subjected to highly accelerated stress tests (HAST) in which the device is subject to 85% relative humidity at 130° C. for 96 hours under certain bias conditions or temperature humidity bias (THB) tests in which the device is subject to 85% relative humidity at 85° C. for 1000 hours under certain bias conditions, the device may fail due to moisture ingress and corrosion.

FIG. 2 illustrates state of the art package level environmental protection. As shown, a semiconductor die 24 is attached to a package substrate 26 using a die attach 28, and wire bonds 30 electrically connect the semiconductor die 24 to the package substrate 26. A number of solder balls 32 may couple the package substrate 26 with a module (not shown), or other circuitry. An encapsulation layer 34 is usually provided over the semiconductor die 24 such that the semiconductor die 24 is completely encapsulated thereby.

Conventionally, the encapsulation layer 34 is an epoxy layer that is extruded or otherwise molded over the package. That is, the encapsulation layer 34 is not a thin film layer and is not provided via a vapor deposition process. While the encapsulation layer 34 of modern packages is quite good at preventing moisture ingress, providing environmental protection at the package level is much more cumbersome and results in a much larger device than when provided at the wafer level.

In light of the above, there is a need for improved environmental protection at both the wafer level and package level.

SUMMARY

The present disclosure relates to semiconductor die and integrated circuit packages including conformal organic protective films for protecting from environmental exposure. In one embodiment, a method includes the steps of fabricating one or more semiconductor devices on a semiconductor wafer and depositing one or more conformal organic environmental protection layers over the semiconductor wafer using a vapor deposition process. By depositing the one or more conformal organic environmental protection layers using a vapor deposition process, thin film conformal organic environmental protection layers may be provided that offer excellent protection against water and oxygen ingress, thus increasing the ruggedness and reliability of the resulting semiconductor die.

In one embodiment, the one or more conformal organic environmental protection layers are liquid crystal polymer layers. Specifically, the one or more conformal organic environmental protection layers may be p-Biphenyl Benzoic Acid.

In one embodiment, the vapor deposition process may be a low pressure, plasma-enhanced chemical vapor deposition (LP-PECVD) process. In another embodiment, the vapor deposition process may be a molecular vapor deposition (MVD) process. In yet another embodiment, the vapor deposition process may be a molecular layer deposition (MLD) process.

In one embodiment, the semiconductor wafer comprises one of gallium nitride (GaN) and gallium arsenide (GaAs). Generally, gallium nitride and gallium arsenide devices are high power (e.g., rated for a blocking voltage greater than 30V) devices that often suffer from reliability problems due to environmental exposure. Providing the conformal organic environmental protection layers significantly increases the ruggedness and reliability of the resulting semiconductor die for these high power devices.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
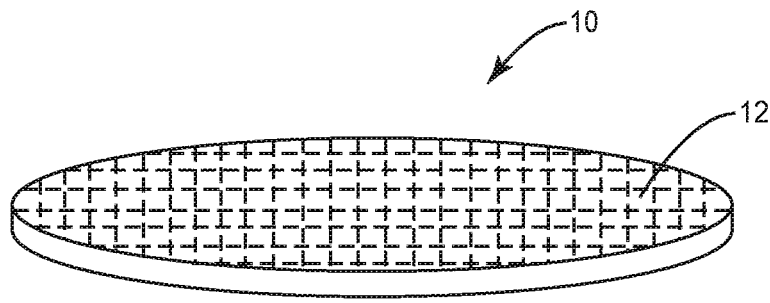
FIG. 1A illustrates a conventional semiconductor wafer.
Figure 1B:
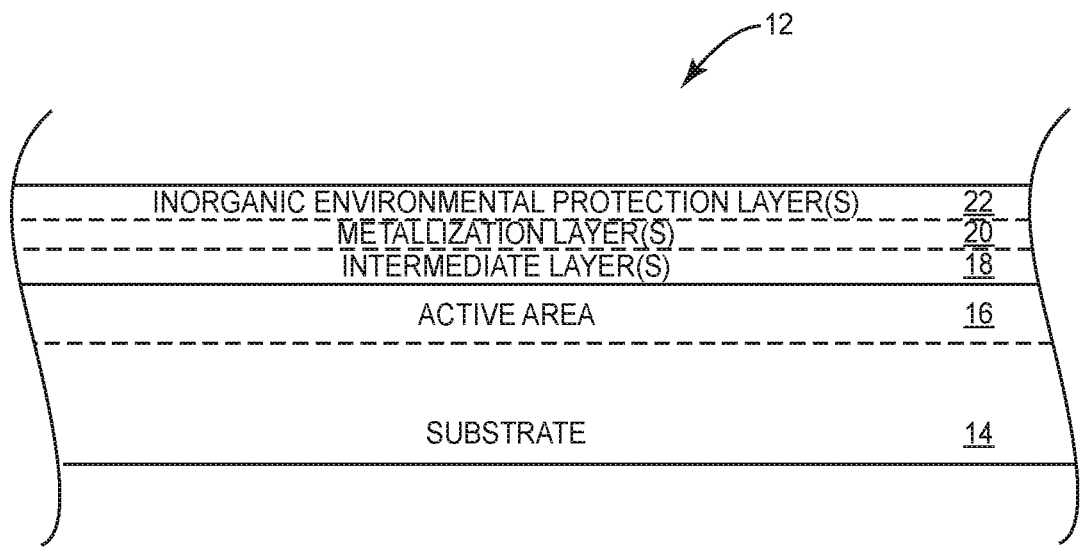
FIG. 1B illustrates a cross-sectional view of a conventional semiconductor die.
Figure 2:
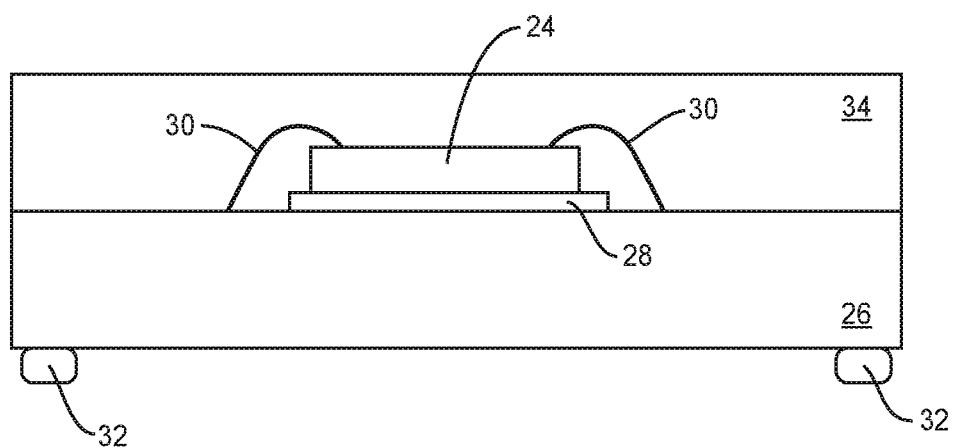
FIG. 2 illustrates a cross-sectional view of a conventional integrated circuit package.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
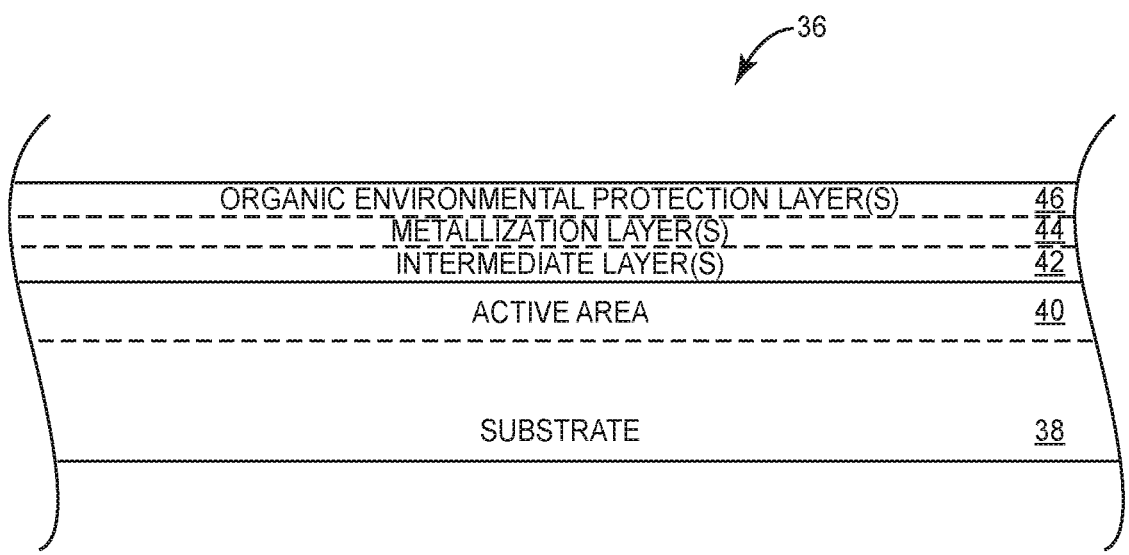
FIG. 3 illustrates a cross-sectional view of a semiconductor die including one or more conformal organic environmental protection layers according to one embodiment of the present disclosure.

FIG. 3 shows a cross-sectional view of a portion of a semiconductor die 36 according to one embodiment of the present disclosure. As shown, the semiconductor die 36 includes a substrate 38, an active area 40 in a top portion of the substrate 38, one or more intermediate layers 42 over the substrate 38, one or more metallization layers 44 over the one or more intermediate layers 42, and one or more conformal organic environmental protection layers 46 over the one or more metallization layers 44. Those skilled in the art will appreciate that the active area 40 may include one or more implanted, diffused, or epitaxially grown regions, and that the one or more intermediate layers 42 and the one or more metallization layers 44 may be patterned to form any number of semiconductor devices in the semiconductor die 36. For example, one or more implanted, diffused, or epitaxial regions in the active area 40 may interact with an intermediate layer 42 of oxide and one or more portions of a metallization layer 44 to form one or more transistors, one or more diodes, or the like.

In some embodiments, the substrate 38 may comprise gallium nitride (GaN) or gallium arsenide (GaAs). Generally, semiconductor die comprising gallium nitride and gallium arsenide are relatively high-power devices (e.g., rated for blocking voltages greater than 30V). Those skilled in the art will appreciate that as the power handling capability of a device increases, so does the potential for damage of the device due to environmental exposure. Accordingly, the one or more conformal organic environmental protection layers 46 are provided to provide a barrier against moisture ingress. Notably, the one or more conformal organic environmental protection layers 46 are thin-film layers deposited by a vapor deposition process such as low pressure, plasma-enhanced chemical vapor deposition (LP-PECVD), molecular vapor deposition (MVD), or molecular layer deposition (MLD). In some embodiments, each of the one or more conformal organic environmental protection layers 46 may thus be less than 10,000 Å, less than 5,000 Å, less than 4,000 Å, less than 3,000 Å, less than 2,000 Å, and less than 1,000 Å. In one embodiment, the one or more conformal organic environmental protection layers 46 comprise a liquid crystal polymer (LCP). For example, the one or more conformal organic environmental protection layers 46 may comprise p-Biphenyl Benzoic Acid. Organic materials such as liquid crystal polymers have very dense polymer carbon-nitrogen (C—N) structures and no oxygen vacancy diffusion at elevated temperatures. Accordingly, these materials provide excellent moisture barriers. Further, these materials are usable at very high frequencies (e.g., up to 110 GHz).

Organic materials such as liquid crystal polymers significantly outperform their inorganic counterparts (e.g., oxides) in terms of water and oxygen permeability and temperature stability. Generally, liquid crystal polymers are second only to ceramics in these terms, and inorganic materials significantly lag behind.

While organic materials such as liquid crystal polymers have been previously used, for example, as package substrates, these applications did not contemplate their use as thin-film environmental protection layers applied via a vapor deposition process (i.e., CVD, MVD, or MLD as discussed above). Rather, conventional applications for working with organic materials such as liquid crystal polymers have been limited to, for example, molding and extrusion. These conventional applications for organic materials did not provide a process by which a thin film layer of said organic materials could be applied, for example, over a semiconductor wafer as shown in FIG. 3.

The conformal organic environmental protection layers 46 may allow the semiconductor die 36 to pass a highly accelerated stress test (HAST) in which the device is subject to 85% relative humidity at 130° C. for 96 hours under certain bias conditions or temperature humidity bias (THB) tests in which the device is subject to 85% relative humidity at 85° C. for 1000 hours under certain bias conditions. This may hold true even for high power (e.g., rated for blocking voltages greater than 30V) devices as discussed above. Since the environmental protection is provided at the wafer level rather than the package level, the size added due to packaging may be eliminated or reduced, thereby reducing the size of a device incorporating the semiconductor die 36.

Figure 4:
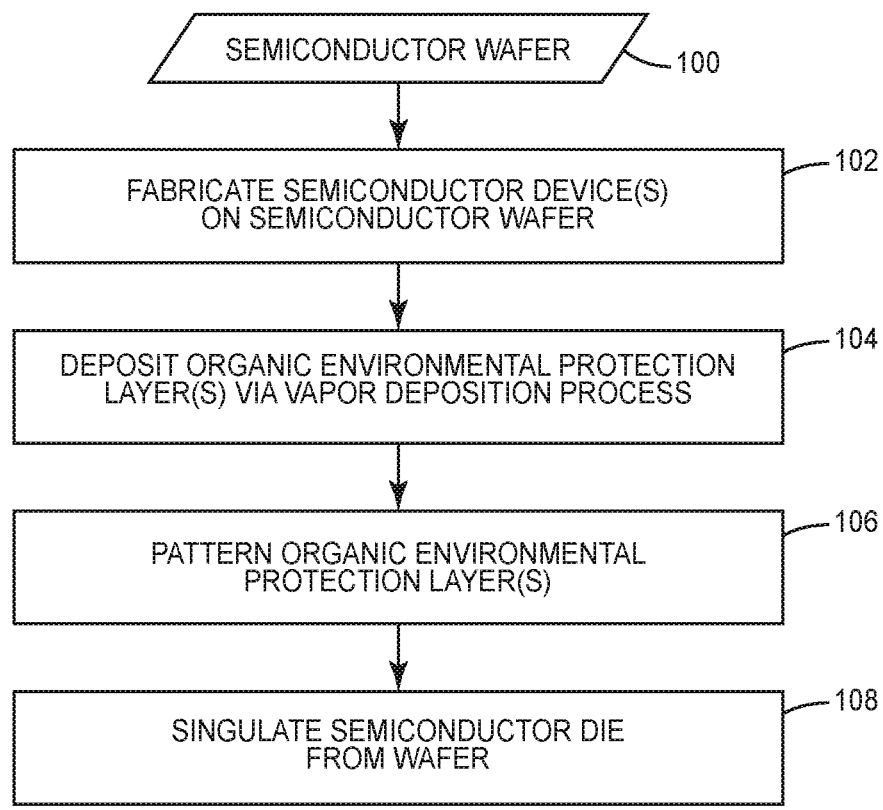
FIG. 4 is a flow chart illustrating a method for providing environmental protection at the wafer level according to one embodiment of the present disclosure.

FIG. 4 is a flow chart illustrating a method for providing environmental protection at the wafer level according to one embodiment of the present disclosure. The process begins with a semiconductor wafer (step 100). First, one or more semiconductor devices are fabricated on the semiconductor wafer (step 102). Those skilled in the art will appreciate that this may involve implanting an active area in the semiconductor wafer, providing one or more intermediate layers over the semiconductor wafer, providing one or more metallization layers over the one or more intermediate layers and/or the semiconductor wafer, and the like. Next, one or more conformal organic environmental protection layers are deposited over the semiconductor wafer using a vapor deposition process (step 104). As discussed above, the vapor deposition process may be a low pressure, plasma-enhanced chemical vapor deposition process (LP-PECVD), a molecular vapor deposition (MVD) process, or a molecular layer deposition (MLD) process. The one or more conformal organic environmental protection layers are thin-film layers that may comprise a liquid crystal polymer such as p-Biphenyl Benzoic Acid, and may be less than 10,000 Å thick. The one or more conformal organic environmental protection layers may then be patterned (step 106). This may involve masking and etching the one or more conformal organic environmental protection layers. For example, plasma etching or the like may be used to pattern the one or more conformal organic environmental protection layers. Patterning of the one or more conformal organic environmental protection layers may be done, for example, to expose one or more contact pads formed by one or more metallization layers for allowing connection to the semiconductor devices in the semiconductor die. Finally, the semiconductor wafer may be singulated into a number of semiconductor die (step 108).

Figure 5:
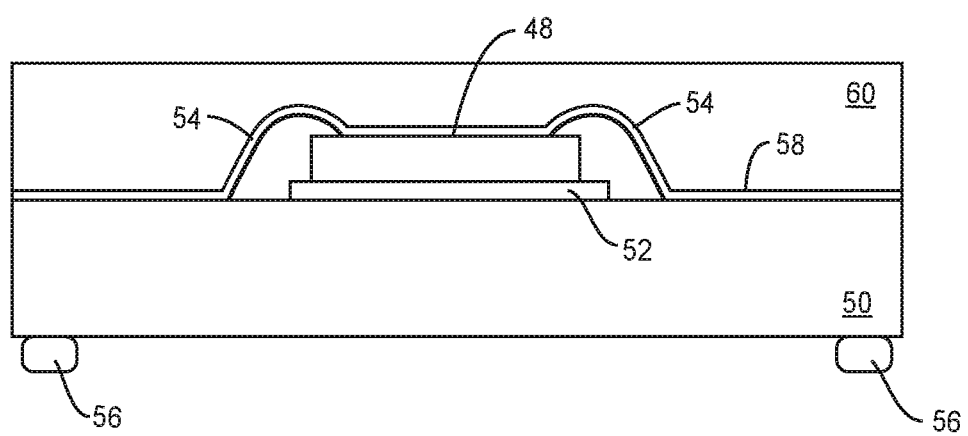
FIG. 5 is a cross-sectional view of an integrated circuit package including one or more conformal organic environmental protection layers according to one embodiment of the present disclosure.

In addition to being used at the wafer level, the use of vapor deposited organic environmental protection layers may also be provided at the package level as illustrated in FIG. 5. As shown, a semiconductor die 48 is attached to a package substrate 50 using a die attach 52, and wire bonds 54 electrically connect the semiconductor die 48 to the package substrate 50. A number of solder balls 56 may couple the package substrate 50 with a module (not shown), or other circuitry. One or more conformal organic environmental protection layers 58 are provided over the semiconductor die 48 and the package substrate 50. In some embodiments, an encapsulation layer 60 is provided over the one or more conformal organic environmental protection layers 58.

As discussed above, the conformal organic environmental protection layers 58 may be thin-film layers deposited by a vapor deposition process such as low pressure, plasma-enhanced chemical vapor deposition (LP-PECVD) or molecular vapor deposition (MVD). In some embodiments, each of the one or more conformal organic environmental protection layers 58 may thus be less than 5,000 Å, less than 4,000 Å, less than 3,000 Å, less than 2,000 Å, and less than 1,000 Å. In one embodiment, the one or more conformal organic environmental protection layers 58 comprise a liquid crystal polymer (LCP). For example, the one or more conformal organic environmental protection layers 58 may comprise p-Biphenyl Benzoic Acid. The semiconductor die 48 may comprise gallium nitride (GaN) or gallium arsenide (GaAs), and further may be a high power (e.g., rated for blocking voltages greater than 30V) device. The one or more conformal organic environmental protection layers 58 may further decrease moisture ingress in the package and thus increase the ruggedness and reliability thereof. Providing the one or more conformal organic environmental protection layers 58 may provide the additional benefit of preventing dendritic growth of metals (i.e whiskers) most notably silver and tin used in die or solder bump attachment, as the one or more conformal organic environmental protection layers 58 act as an inhibitor of said metal dendrides.

Figure 6:
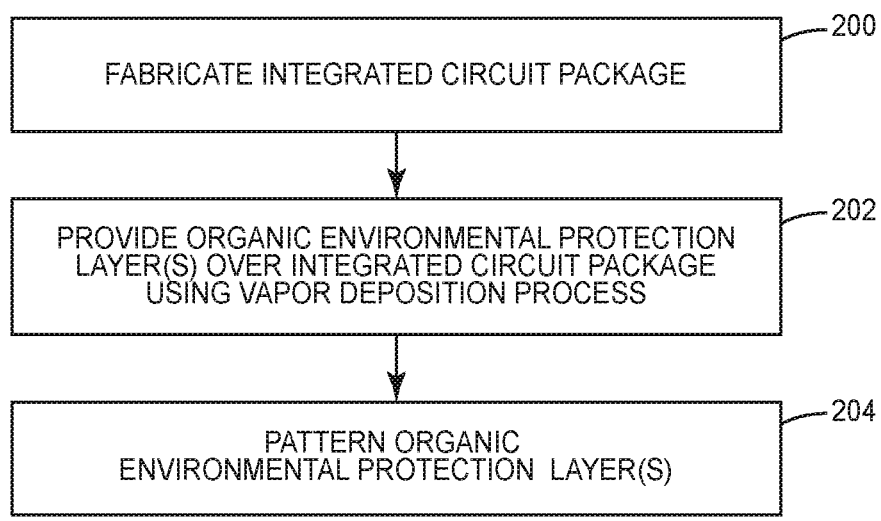
FIG. 6 is a flow chart illustrating a method for providing environmental protection at the package level according to one embodiment of the present disclosure.

FIG. 6 is a flow chart illustrating a method for providing environmental protection at the package level according to one embodiment of the present disclosure. First, an integrated circuit package is fabricated (step 200). Those skilled in the art will appreciate that this may involve, for example, providing a package substrate or other package base and mounting one or more semiconductor die thereto (both mechanically and electrically). Next, one or more conformal organic environmental protection layers are deposited over the semiconductor die and package (step 202). As discussed above, the vapor deposition process may be a low pressure, plasma-enhanced chemical vapor deposition process (LP-PECVD) or a molecular vapor deposition (MVD) process. The one or more environmental protection layers are thin-film layers that may comprise a liquid crystal polymer such as p-Biphenyl Benzoic Acid, and may be less than 5,000 Å thick. The one or more environmental protection layers may then be patterned (step 204). This may involve masking and etching the one or more environmental protection layers. For example, plasma etching or the like may be used to pattern the one or more environmental protection layers. Patterning the one or more conformal organic environmental protection layers may, for example, provide access to one or more contact pads for the package.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:
a substrate with a first surface;
at least one semiconductor device with contact pads, wherein the at least one semiconductor device is formed on the first surface of the substrate;
at least one patterned conformal organic environmental protection layer formed over the first surface of the substrate, wherein:
   a thickness of the at least one patterned conformal organic environmental protection layer is less than 10,000 Å;
   the at least one patterned conformal organic environmental protection layer and the at least one semiconductor device are located on a same side of the first surface of the substrate;
   the at least one patterned conformal organic environmental protection layer partially covers the at least one semiconductor device, such that the contact pads of the at least one semiconductor device are exposed; and
   portions of the at least one patterned conformal organic environmental protection layer are in direct contact with the first surface of the substrate.

2. The semiconductor die of claim 1 wherein the at least one patterned conformal organic environmental protection layer comprises conformally deposited liquid crystal polymer (LCP).

3. The semiconductor die of claim 2 wherein the substrate comprises one of gallium nitride (GaN) and gallium arsenide (GaAs).

4. The semiconductor die of claim 2 wherein the at least one patterned conformal organic environmental protection layer comprises p-Biphenyl Benzoic Acid.

5. The semiconductor die of claim 4 wherein the substrate comprises one of gallium nitride (GaN) and gallium arsenide (GaAs).

6. The semiconductor die of claim 2 wherein the at least one patterned conformal organic environmental protection layer has a thickness less than 5,000 Å.

7. The semiconductor die of claim 1 wherein the substrate comprises one of gallium nitride (GaN) and gallium arsenide (GaAs).

8. The semiconductor die of claim 1 further comprising an encapsulation layer over the at least one patterned conformal organic environmental protection layer.

* * * * *